United States Patent
Oh et al.

(10) Patent No.: US 8,107,508 B2
(45) Date of Patent: Jan. 31, 2012

(54) EXTERNAL CAVITY LASER LIGHT SOURCE

(75) Inventors: Su Hwan Oh, Daejeon (KR); Kihong Yoon, Daejeon (KR); Kisoo Kim, Daejeon (KR); Dae Kon Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 47 days.

(21) Appl. No.: 12/541,561

(22) Filed: Aug. 14, 2009

(65) Prior Publication Data

US 2010/0238962 A1  Sep. 23, 2010

(30) Foreign Application Priority Data

Mar. 23, 2009  (KR) .................. 10-2009-0024623

(51) Int. Cl.
*H01S 3/08* (2006.01)
(52) U.S. Cl. .................... 372/92; 372/45.01; 372/43.01; 372/50.1
(58) Field of Classification Search ............... 372/43.01, 372/45.01, 50.1, 92
See application file for complete search history.

(56) References Cited

U.S. PATENT DOCUMENTS

| | | | | |
|---|---|---|---|---|
| 4,901,123 A * | 2/1990 | Noguchi et al. | ................. | 257/98 |
| 5,561,680 A | 10/1996 | Haberern et al. | | |
| 5,937,120 A * | 8/1999 | Higashi | ............................ | 385/49 |
| 6,253,009 B1 * | 6/2001 | Lestra et al. | ..................... | 385/50 |
| 6,411,764 B1 * | 6/2002 | Lee | ................ | 385/131 |
| 6,687,278 B1 * | 2/2004 | Mason et al. | ............. | 372/50.22 |
| 7,046,435 B2 * | 5/2006 | Shin et al. | ...................... | 359/344 |
| 7,688,870 B2 * | 3/2010 | Oh et al. | ........................... | 372/1 |
| 7,738,167 B2 * | 6/2010 | Kim et al. | ...................... | 359/344 |
| 7,920,322 B2 * | 4/2011 | Oh et al. | ........................ | 359/344 |
| 2005/0185264 A1 * | 8/2005 | Shin et al. | ...................... | 359/344 |
| 2006/0034576 A1 * | 2/2006 | Merritt et al. | ................. | 385/129 |
| 2007/0133990 A1 * | 6/2007 | Kim et al. | ........................ | 398/72 |
| 2007/0223551 A1 | 9/2007 | Park et al. | | |
| 2008/0137180 A1 * | 6/2008 | Oh et al. | ........................ | 359/344 |
| 2009/0154514 A1 * | 6/2009 | Oh et al. | .................. | 372/45.011 |
| 2010/0209108 A1 * | 8/2010 | Kim et al. | ........................ | 398/67 |

(Continued)

FOREIGN PATENT DOCUMENTS

JP  06-181366 A  6/1994

(Continued)

OTHER PUBLICATIONS

Oh, Su Hwan et al., "High-Performance 1.55- µm Superluminescent Diode With Butt-Coupled Spot-Size Converter", IEEE Photonics Technology Letters, vol. 20, No. 11, pp. 894-896, Jun. 1, 2008.

(Continued)

*Primary Examiner* — Jessica Stultz
*Assistant Examiner* — Delma R Forde
(74) *Attorney, Agent, or Firm* — Rabin & Berdo, PC

(57) ABSTRACT

Provided is an external cavity laser light source. The light source includes a substrate, an optical waveguide, and a current blocking layer. The optical waveguide includes a passive waveguide layer, a lower clad layer, an active layer, and an upper clad layer that are sequentially stacked on the substrate and is divided into regions including a linear active waveguide region, a bent active waveguide region, a tapered waveguide region, and a window region. The current blocking layer was formed an outside of the active layer to reduce leakage current. The linear and bent active waveguide regions have a buried heterostructure (BH), and the tapered waveguide region and the window region have a buried ridge stripe (BRS) structure. The passive waveguide layer a width substantially equal to a maximal width of the tapered waveguide region at least in the bent active waveguide region, the tapered waveguide region, and the window region.

20 Claims, 5 Drawing Sheets

U.S. PATENT DOCUMENTS

2010/0214651 A1 * 8/2010 Kim et al. .................... 359/344

FOREIGN PATENT DOCUMENTS

| | | |
|---|---|---|
| JP | 10-228005 A | 8/1998 |
| KR | 10-0369329 | 1/2003 |
| KR | 10-0406865 | 11/2003 |
| KR | 100670830 | 1/2007 |
| KR | 10-0710956 | 4/2007 |
| KR | 10-0842277 | 6/2008 |

OTHER PUBLICATIONS

Okamoto, H. et al., "Narrow-beam 1.3 μm superluminescent diode with butt-jointed selectively grown spot-size converter", Electronics Letters, vol. 33, No. 9, pp. 811-812, Apr. 24, 1997.

Noh, Young-Ouk et al., "Continuously tunable compact lasers based on thermo-optic polymer waveguides with Bragg gratings", Optics Express, vol. 16, No. 22, pp. 18194-18201, Oct. 27, 2008.

* cited by examiner

EXTERNAL CAVITY LASER LIGHT SOURCE

CROSS-REFERENCE TO RELATED APPLICATIONS

This U.S. non-provisional patent application claims priority under 35 U.S.C. §119 of Korean Patent Application No. 10-2009-0024623, filed on Mar. 23, 2009, the entire contents of which are hereby incorporated by reference.

BACKGROUND OF THE INVENTION

The present invention disclosed herein relates to an external cavity laser, and more particularly, to a superluminescent diode (SLD) and a reflective semiconductor optical amplifier (R-SOA) that are used as external cavity laser light sources.

There are various light sources of an optical line terminal (OLT) and an optical network unit (ONU), which are used for a wavelength division multiplexing passive optical network (WDM-PON). In the previous paper (Optics Express, Vol. 16, No. 22, pp. 18194-18201), a planar lightwave circuit external cavity laser (PLC-ECL) is disclosed, which is fabricated by a hybrid integration method using an SLD and a polymer waveguide in which a grating are formed. The paper provides a detailed description of a wavelength tunable external cavity laser of which the wavelength can be varied by applying a current to a polymer grating. Owing to the use of the polymer grating, the wavelength tunable external cavity laser can be fabricated with low costs, and thus a WDM-PON using the wavelength tunable external cavity laser can be constructed with low costs.

Since characteristics of such an external cavity laser are generally determined by a light source, much research is being conducted on light sources. A light source of an external cavity laser should not lase, when a reflectivity of an output facet is less than 0.1%, and the light source should have high gain in a low operational current condition. Examples of light sources satisfying such requirements include a Fabry-Perot laser diode (FP-LD) and an SLD. An FP-LD includes an anti-reflection (AR) coated output facet having a reflectivity of less than 0.1% for reducing reflection at the output facet, and a high-reflection (HR) coated facet opposite to the output facet for increasing its gain. Although the output facet of an FP-LD has a reflectivity of less than 0.1% by anti-reflection coating, it is generally difficult to prevent lasing of the FP-LD, and the lasing yield is reduced. Nowadays, the Japanese NTT group produces multi-channel external cavity lasers by using anti-reflection and high-reflection coated FP-LDs. A light source suitable as such an anti-reflection FP-LD is an SLD.

Generally, an SLD includes an active layer or an optical waveguide sloped at an angle of 7°~10° so as to reduce the reflectivity of an output facet. In this case, although the reflectivity of the output facet can be reduced, the SLD is not suitable for a WDM-PON due to an increased threshold current and operational current. Therefore, much research is currently underway to develop an SLD as a light source having characteristics comparable to those of an anti-reflection and high-reflection coated FP-LP.

An R-SOA is used in an ONU for the simple purpose of amplification and modulation of incoherent light assigned to each subscriber. Although there is a slight spectrum variation due to an external factor, the output power of an R-SOA is not largely varied, and owing to gain saturation, the R-SOA has low relative intensity noise. Therefore, much research is currently conducted to develop an R-SOA as a low-power-consumption light source having a low threshold current and operating current for using the R-SOA in a WDM-PON.

SUMMARY OF THE INVENTION

The present invention provides a superluminescent diode (SLD) that can emit a circular light having a narrow far field pattern (FFP), while having high gain in a low current condition, low power consumption characteristics owing to its low threshold current value, and good high-frequency modulation characteristics at more than 1.25 Gb/s.

The present invention also provides a reflective semiconductor optical amplifier (R-SOA) that can emit a circular light having a narrow far field pattern (FFP), while having high gain in a low current condition, low power consumption characteristics owing to its low threshold current value, and good high-frequency modulation characteristics at more than 1.25 Gb/s.

The object of the present invention is not limited to the aforesaid, but other objects not described herein will be clearly understood by those skilled in the art from descriptions below.

Embodiments of the present invention provide SLDs. The SLDs include: a substrate; a optical waveguide including a passive waveguide layer, a lower clad layer, an active layer, and an upper clad layer that are sequentially stacked on the substrate, the optical waveguide being divided into regions including a linear active waveguide region, a bent active waveguide region, a tapered waveguide region, and a window region; and a current blocking layer formed an outside of the active layer to reduce the leakage current. The linear active waveguide region and the bent active waveguide region have a buried heterostructure (BH), and the tapered waveguide region and the window region have a buried ridge stripe (BRS) structure. The passive waveguide layer has substantially the same width as that of the linear active waveguide region and is provided in the linear active waveguide region, the bent active waveguide region, the tapered waveguide region, and the window region.

In some embodiments, the active layer may have a polarization-dependent multiple quantum well (MQW) structure.

In other embodiments, the tapered waveguide region may have a length of about 110 μm.

In still other embodiments, the bent active waveguide region and the tapered waveguide region may be connected to each other by a butt-coupling method. A butt interface disposed between the bent active waveguide region and the tapered waveguide region may make angle of about 5°~45° with the linear active waveguide region.

In even other embodiments, the SLDs may further include a trench formed at the outside of the active layer by removing portions of the current blocking layer and the substrate. Owing to the trench, the SLDs may have modulation characteristics of more than 1.25 Gb/s. The substrate at an outside of the BRS structure may be etched to have an upper surface which is lower than a lower surface of the passive waveguide layer about 1 μm to about 5 μm.

In yet other embodiments, the passive waveguide layer may have a width of about 1 μm to about 10 μm.

In other embodiments of the present invention, SLDs are provided. The SLDs include: a substrate; a optical waveguide including a passive waveguide layer, a lower clad layer, an active layer, and an upper clad layer that are sequentially stacked on the substrate, the optical waveguide being divided into regions including a linear active waveguide region, a bent active waveguide region, a tapered waveguide region, and a window region; and a current blocking layer formed an outside of the active layer to reduce the leakage current. The linear active waveguide region and the bent active waveguide region have a buried heterostructure (BH), and the tapered waveguide region and the window region have a buried ridge stripe (BRS) structure. The passive waveguide layer is provided on an entire surface of the substrate in the linear active waveguide region and has a width substantially equal to a maximal width of the tapered waveguide region in the bent active waveguide region, the tapered waveguide region, and the window region.

In some embodiments, the active layer may have a polarization-dependent multiple quantum well (MQW) structure.

In other embodiments, the tapered waveguide region may have a length of about 110 μm.

In still other embodiments, the bent active waveguide region and the tapered waveguide region may be connected to each other by a butt-coupling method. A butt interface disposed between the bent active waveguide region and the tapered waveguide region may make angle of about 5°~45° with the linear active waveguide region.

In even other embodiments, the SLDs may further include a trench formed at the outside of the active layer by removing portions of the current blocking layer and the substrate. Owing to the trench, the SLDs may have modulation characteristics of more than 1.25 Gb/s. The substrate at an outside of the BRS structure may be etched to have an upper surface which is lower than a lower surface of the passive waveguide layer about 1 μm to about 5 μm.

In yet other embodiments, the passive waveguide layer may have a width of about 1 μm to about 10 μm.

In still other embodiments of the present invention, R-SOAs are provided. The R-SOAs include: a substrate optical waveguide including a passive waveguide layer, a lower clad layer, an active layer, and an upper clad layer that are sequentially stacked on the substrate, the optical waveguide being divided into regions including a linear active waveguide region, a bent active waveguide region, a tapered waveguide region, and a window region; and a current blocking layer formed an outside of the active layer to reduce leakage current. The linear active waveguide region and the bent active waveguide region have a buried heterostructure (BH), and the tapered waveguide region and the window region have a buried ridge stripe (BRS) structure. The passive waveguide layer has substantially the same width as that of the linear active waveguide region and is provided in the linear active waveguide region, the bent active waveguide region, the tapered waveguide region, and the window region.

In some embodiments, the active layer may have a polarization-independent bulk structure.

In other embodiments, the tapered waveguide region may have a length of about 110 μm.

In still other embodiments, the bent active waveguide region and the tapered waveguide region may be connected to each other by a butt-coupling method. A butt interface disposed between the bent active waveguide region and the tapered waveguide region may make angle of about 5°~45° with the linear active waveguide region.

In even other embodiments, the R-SOAs may further include a trench formed at the outside of the active layer by removing portions of the current blocking layer and the substrate. Owing to the trench, the R-SOAs may have modulation characteristics more than 1.25 Gb/s. The substrate at an outside of the BRS structure may be etched to have an upper surface which is lower than a lower surface of the passive waveguide layer about 1 μm to about 5 μm.

In yet other embodiments, the passive waveguide layer may have a width of about 1 μm to about 10 μm.

In even other embodiments of the present invention, R-SOAs are provided. The R-SOAs include: a substrate; a optical waveguide including a passive waveguide layer, a lower clad layer, an active layer, and an upper clad layer that are sequentially stacked on the substrate, the optical waveguide being divided into regions including a linear active waveguide region, a bent active waveguide region, a tapered waveguide region, and a window region; and a current blocking layer formed an outside of the active layer to reduce the leakage current. The linear active waveguide region and the bent active waveguide region have a buried heterostructure (BH), and the tapered waveguide region and the window region have a buried ridge stripe (BRS) structure. The passive waveguide layer is provided on an entire surface of the substrate in the linear active waveguide region and has a width substantially equal to a maximal width of the tapered waveguide region in the bent active waveguide region, the tapered waveguide region, and the window region.

In some embodiments, the active layer may have a polarization-independent bulk structure.

In other embodiments, the tapered waveguide region may have a length of about 110 μm.

In still other embodiments, the bent active waveguide region and the tapered waveguide region may be connected to each other by a butt-coupling method. A butt interface disposed between the bent active waveguide region and the tapered waveguide region may make angle of about 5°~45° with the linear active waveguide region.

In even other embodiments, the R-SOAs may further include a trench formed at the outside of the active layer by removing portions of the current blocking layer and the substrate. Owing to the trench, the R-SOAs may have modulation characteristics of more than 1.25 Gb/s. The substrate at an outside of the BRS structure may be etched to have an upper surface which is lower than a lower surface of the passive waveguide layer about 1 μm to about 5 μm.

In yet other embodiments, the passive waveguide layer may have a width of about 1 μm to about 10 μm.

According to the above-described embodiments of the present invention, the SLD includes the optical waveguide in which the active layer and the passive waveguide layer are configured to have the same width at least in the bent active waveguide region, the tapered waveguide region, and the window region, so that the SLD can emit light having a narrow FFP. Owing to this narrow FFP characteristic, the SLD can have good characteristics such as high gain at a low operating current range, low power consumption owing to a low threshold current, and good high-frequency modulation characteristics of more than 1.25 Gb/s.

In addition, according to the above-described embodiments of the present invention, the R-SOA includes the optical waveguide in which the active layer and the passive waveguide layer are configured to have the same width at least in the bent active waveguide region, the tapered waveguide region, and the window region, so that the R-SOA can emit light having a narrow FFP. Owing to this narrow FFP characteristic, the R-SOA can have good characteristics such as high gain at a low operating current range, low power consumption owing to a low threshold 1 current, and good high-frequency modulation characteristics of more than 1.25 Gb/s.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1A:
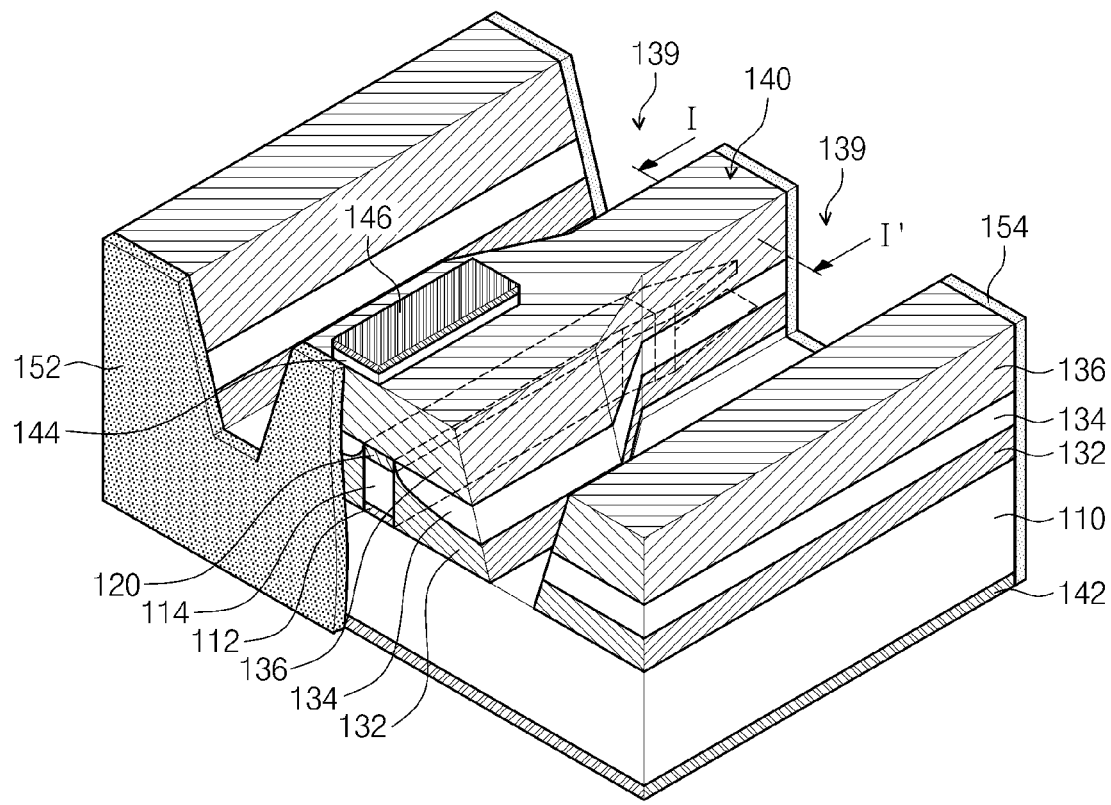
FIG. 1A is a perspective view illustrating an external cavity laser light source according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto. It will be understood that when an element such as a layer, film, region, or substrate is referred to as being "on" another element, it can be directly on the other element or intervening elements may also be present.

Additionally, the embodiment in the detailed description will be described with reference to sectional views and/or plan views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etching region illustrated as angular may have a round shape or a certain curvature. Therefore, regions exemplified in the drawings have general properties, and are used to illustrate a specific shape of a device region. Thus, this should not be construed as limiting the scope of the present invention.

Figure 1B:
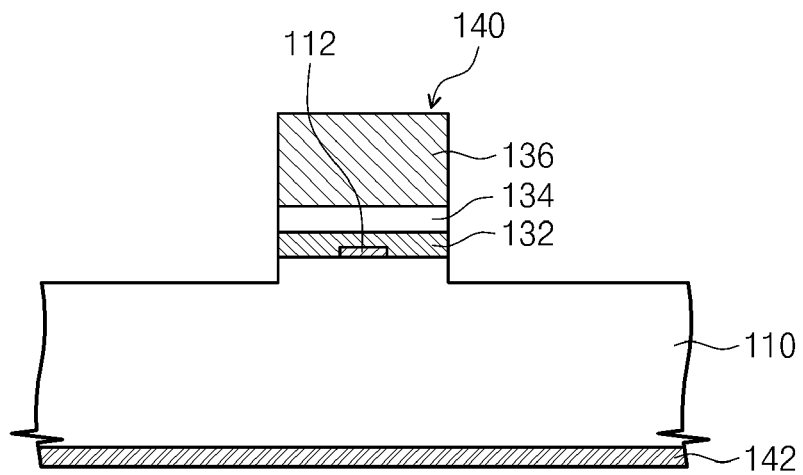
FIG. 1B is a sectional view taken along line I-I' of FIG. 1A.
Figure 1C:
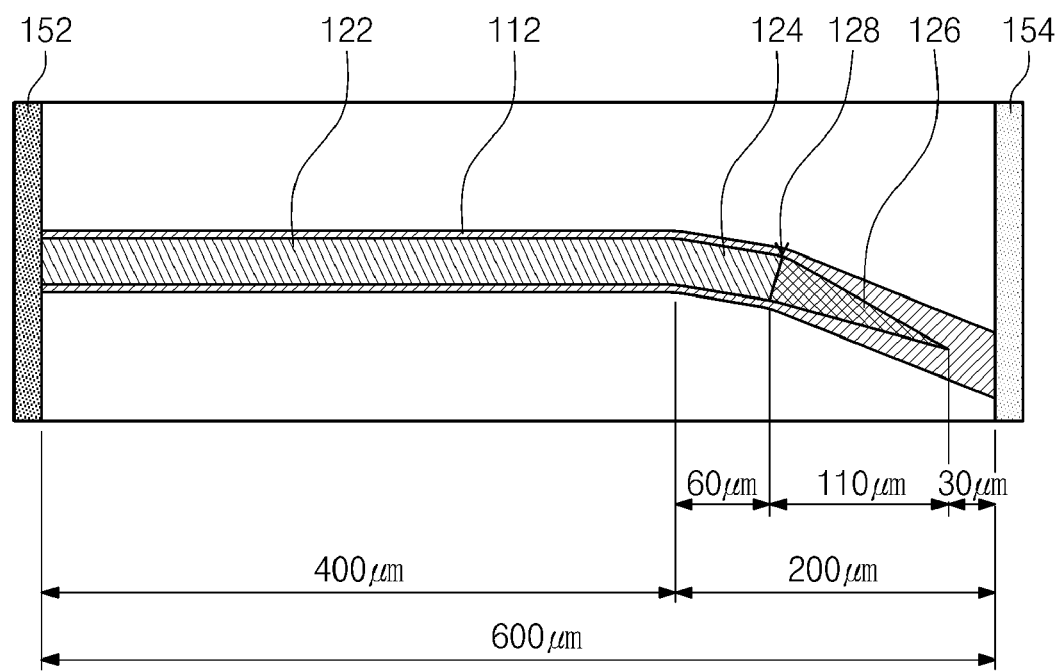
FIG. 1C is a partial sectional view of an optical waveguide for illustrating a passive waveguide and an active layer of the external cavity laser light source of FIG. 1A.

FIG. 1A is a perspective view illustrating an external cavity laser light source according to an embodiment of the present invention, and FIG. 1B is a sectional view taken along line I-I' of FIG. 1A. FIG. 1C is a partial sectional view of an optical waveguide for illustrating a passive waveguide and an active layer of the external cavity laser light source of FIG. 1A.

Referring to FIGS. 1A to 1C, the external cavity laser light source includes a substrate 10, an optical waveguide, a current blocking layer, trenches 139, a lower electrode 142, an ohmic layer 144, an upper electrode 146, a high-reflection facet 152, and an anti-reflection facet 154.

The substrate 110 may be formed of a compound semiconductor. For example, the substrate 110 may be formed of n-InP.

The optical waveguide may include a passive waveguide layer 112, a lower clad layer 114, an active layer 120, and an upper clad layer 136. The optical waveguide may be formed by sequentially stacking the passive waveguide layer 112, the lower clad layer 114, the active layer 120, and the upper clad layer 136 on the substrate 110. The optical waveguide may include a linear active waveguide region 122, a bent active waveguide region 124, a tapered waveguide region 126, and a window region. The optical waveguide may be a ridge waveguide. In this case, the optical waveguide may include a ridge part 140, which makes contact with the anti-reflection facet 154 and is narrower than the optical waveguide contacted with the high-reflection facet 152.

The length of a light source should be short for improving modulation characteristics of an external cavity laser. For this purpose, the length of the active layer 120 can be reduced, or the tapered waveguide region 126 can be reduced. The latter case have resulted better effects.

In the external cavity laser light source of the current embodiment, the length of the optical waveguide is about 600 μm, the length of the linear active waveguide region 122 is about 400 μm, the length of the bent active waveguide region 124 is about 60 μm, the length of the tapered waveguide region 126 is about 110 μm, and the length of the window region is about 30 μm.

The passive waveguide layer 112 and the active layer 120 may have substantially the same width, and the passive waveguide layer 112 may be disposed an under side of the active layer 120. The passive waveguide layer 112 may have a width in the range from about 1 μm to about 10 μm. The passive waveguide layer 112 may have a uniform width along the linear active waveguide region 122, the bent active waveguide region 124, the tapered waveguide region 126, and the window region. The passive waveguide layer 112 may be an n-InGaAsP layer.

Although it is illustrated that the passive waveguide layer 112 is wider than the linear active waveguide region 122 of the active layer 120 in FIG. 1C, the passive waveguide layer 112 has the same width as the width of the linear active waveguide region 122 of the active layer 120 as shown in FIG. 1A.

The lower clad layer 114 may be disposed between the passive waveguide layer 112 and the active layer 120 of the linear and bent active waveguide regions 122 and 124. The lower clad layer 114 may be an n-InP layer.

The active layer 120 may be divided into the linear active waveguide region 122, the bent active waveguide region 124, and the tapered waveguide region 126. The linear active waveguide region 122 and the bent active waveguide region 124 of the active layer 120 may have a buried heterostructure (BH), and the tapered waveguide region 126 and the window region of the active layer 120 may have a buried ridge stripe (BRS) structure.

The bent active waveguide region 124 and the tapered waveguide region 126 may be connected to each other by a butt-coupling method, and thus a butt interface 128 may be formed between the bent active waveguide region 124 and the tapered waveguide region 126. The butt interface 128 between the bent active waveguide region 124 and the tapered waveguide region 126 may have an angle of about 5°~45° with the linear active waveguide region 122.

An end of the tapered waveguide region 126 has a size of less than 0.1 µm. The linear active waveguide region 122 and the passive waveguide layer 112 have the same width of about 1 µm to about 10 µm, and the end of the tapered waveguide region 126 has a size of less than 0.1 µm. Therefore, optical mode size can be varied. In addition, back reflection of light can be reduced.

The tapered waveguide region 126 is provided to reduce reflection of light at an input/output facet. For this end, the tapered waveguide region 126 may make an angle of about 5°~15° with a light propagation direction. If the tapered waveguide region 126 is largely sloped, reflection of light at the input/output facet can be largely reduced. In this case, however, optical loss at the bent active waveguide region 124 increases, and thus the gain of the external cavity laser light source reduces. Meanwhile, such optical loss can be minimized because optical coupling efficiency increases owing to the passive waveguide layer 112 disposed at the under of the active layer 120.

The active layer 120 may have a polarization-dependent, stress-relaxation multiple quantum well (MQW) structure or a polarization-independent stress relaxation bulk structure. In the case where the active layer 120 has a MQW structure, the external cavity laser light source may be a superluminescent diode (SLD). If the active layer 120 has a bulk structure, the external cavity laser light source may be a reflective semiconductor optical amplifier (R-SOA).

The upper clad layer 136 may cover the passive waveguide layer 112 and the active layer 120. The upper clad layer 136 may be a p-InP layer.

The current blocking layer may be disposed in the vicinity of the active layer 120. The current blocking layer may include a first current blocking layer 132, a second current blocking layer 134, and the upper clad layer 136 that are sequentially stacked. The current blocking layer may prevent a leakage current at the outside of the active layer 120. The first current blocking layer 132 may be a p-InP layer, and the second current blocking layer 134 may be an n-InP layer.

The trenches 139 may be formed at sides of the active layer 120 by partially removing the current blocking layer and the substrate 110. For example, the trenches 139 may be formed in the vicinity of the active layer 120 by sequentially etching portions of the upper clad layer 136, the second current blocking layer 134, the first current blocking layer 132, and the substrate 110. In an etching process, the ridge part 140 of the optical waveguide may be formed together with the trenches 139. The substrate 110 at an outside of the BRS structure may be etched to have an upper surface which is lower than a lower surface of the passive waveguide layer 112 about 1 µm to about 5 µm.

For high-speed modulation of more than 1.25 Gb/s, the trenches 139 may reduce parasitic capacitance in the vicinities of the active layer 120 and the current blocking layer provided to prevent outflow of current from the active layer 120. Therefore, the external cavity laser light source can have high-speed modulation ability of more than 1.25 Gb/s.

The lower electrode 142 may be disposed on the bottom surface of the substrate 110, and the upper electrode 146 may be disposed at the upper clad layer 136 with the ohmic layer 144 being disposed therebetween. The lower electrode 142 may be an n-type electrode, and the upper electrode 146 may be a p-type electrode. The ohmic layer 144 may be a p-InGaAs layer.

The high-reflection facet 152 may be disposed at an end of the linear active waveguide region 122 of the optical waveguide, and the anti-reflection facet 154 may be disposed at an end of the window region of the optical waveguide opposite to the high-reflection facet 152. The high-reflection facet 152 may increase the gain of the external cavity laser light source, and the anti-reflection facet 154 may reduce reflection at the output facet of the external cavity laser light source.

Figure 2:
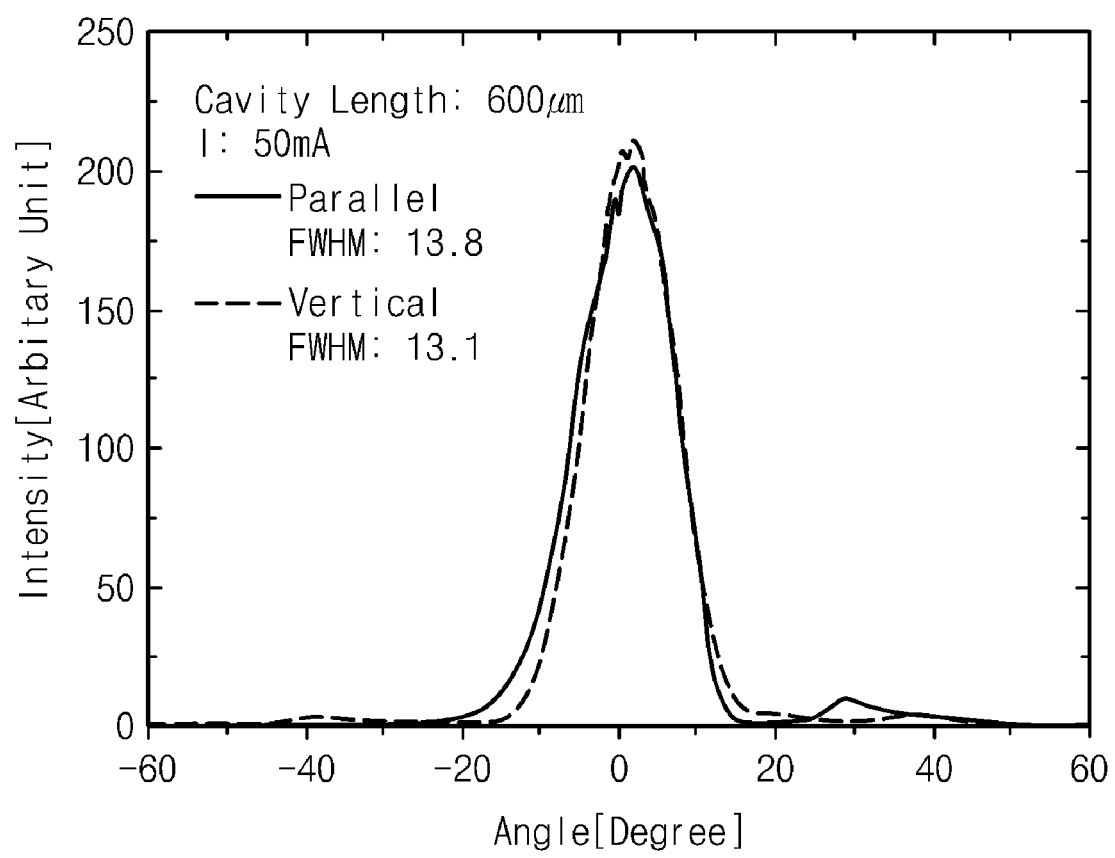
FIG. 2 is a graph showing far field pattern (FFP) characteristics of the external cavity laser light source according to the embodiment of the present invention.

FIG. 2 is a graph showing far field pattern (FFP) of the external cavity laser light source according to the embodiment of the present invention.

Referring to FIG. 2, FFP characteristics of the external cavity laser light source are shown. Measured full width at half maximums (FWHMs) of horizontal and vertical components (indicated by solid and dashed lines, respectively) of the FFP of the external cavity laser light source were 13.8° and 13.1°, respectively, when the length of the optical waveguide was about 600 µm, the widths of the active layer and the passive waveguide layer were about 1 µm to 1.5 µm, and an operational current was 50 mA. That is, in the current embodiment, the FFP of the external cavity laser light source is approximately circular. Therefore, the external cavity laser light source of the current embodiment can have high coupling efficiency when the external cavity laser light source is coupled with other optical devices such as an optical fiber, and a polymer or silica waveguide by using a hybrid integration method.

Generally, the FFP of an external cavity laser light source can be reduced by increasing the ridge width of a ridge optical waveguide. However, generally, the FFP of an external cavity laser light source is elliptical regardless of the ridge width of a ridge optical waveguide. That is, it is difficult to make an external cavity laser light source have a circular FFP by adjusting the ridge width of a ridge optical waveguide. However, according to the current embodiment of the present invention, since the active layer and the passive waveguide layer of the external cavity laser light source have the same width, the FFP of the external cavity laser light source can approximately be circular.

Figure 3A:
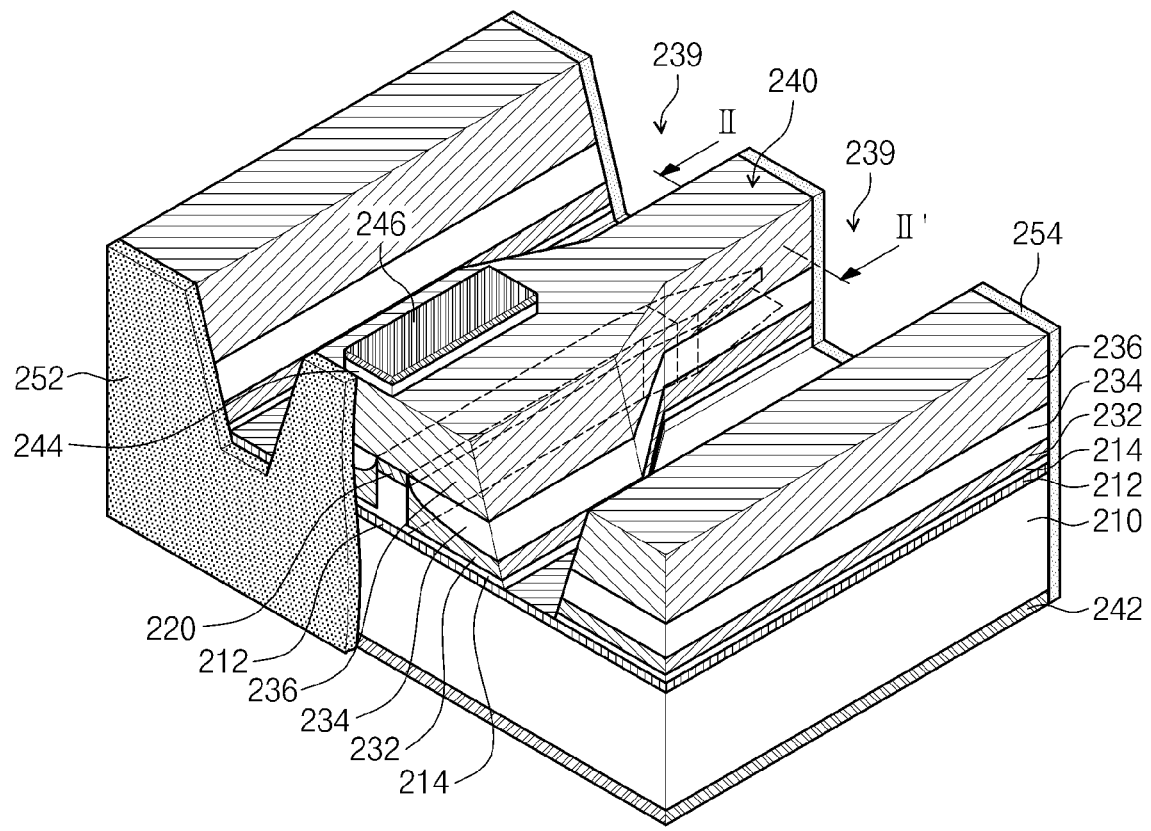
FIG. 3A is a perspective view illustrating an external cavity laser light source according to another embodiment of the present invention.
Figure 3B:
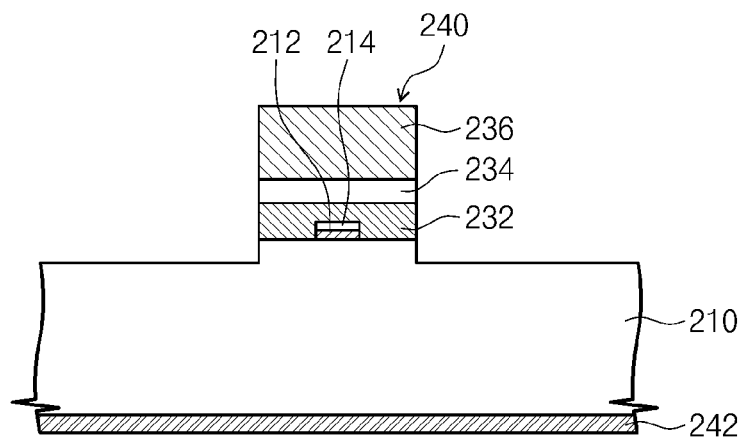
FIG. 3B is a sectional view taken along line II-II' of FIG. 3A.
Figure 3C:
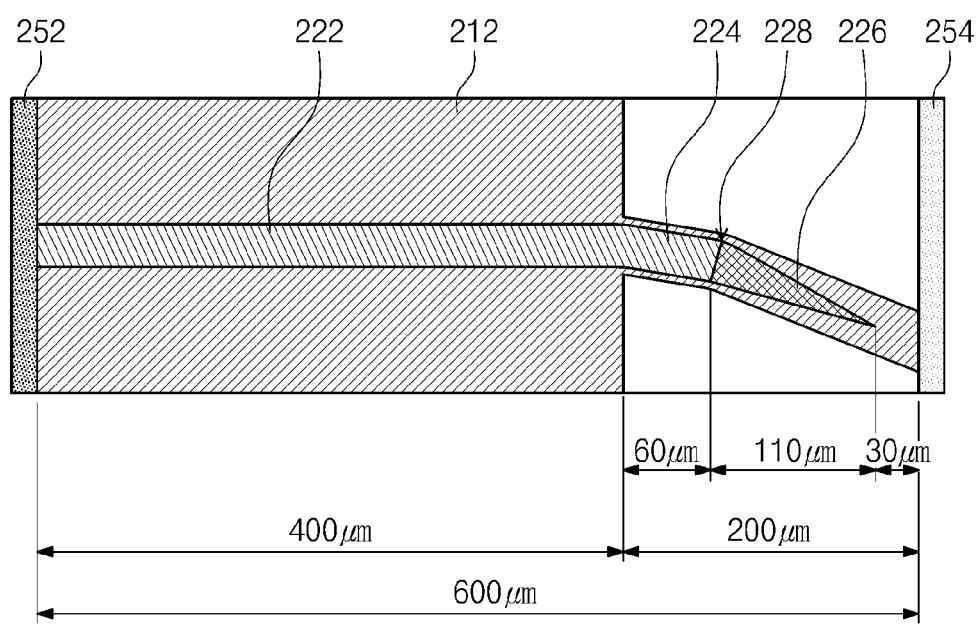
FIG. 3C is a partial sectional view of an optical waveguide for illustrating a passive waveguide and an active layer of the external cavity laser light source of FIG. 3A.

FIG. 3A is a perspective view illustrating an external cavity laser light source according to another embodiment of the present invention, and FIG. 3B is a sectional view taken along line II-II' of FIG. 3A. FIG. 3C is a partial sectional view of an optical waveguide for illustrating a passive waveguide and an active layer of the external cavity laser light source of FIG. 3A.

Referring to FIGS. 3A to 3C, the external cavity laser light source includes a substrate 210, an optical waveguide, a current blocking layer, trenches 239, a lower electrode 242, an ohmic layer 244, an upper electrode 246, a high-reflection facet 252, and an anti-reflection facet 254.

The substrate 210 may be formed of a compound semiconductor. For example, the substrate 210 may be formed of n-InP.

The optical waveguide may include a passive waveguide layer 212, a lower clad layer 214, an active layer 220, and an upper clad layer 236. The optical waveguide may be formed by sequentially stacking the passive waveguide layer 212, the lower clad layer 214, the active layer 220, and the upper clad layer 236 on the substrate 210. The optical waveguide may include a linear active waveguide region 222, a bent active waveguide region 224, a tapered waveguide region 226, and a window region. The optical waveguide may be a ridge waveguide. In this case, the optical waveguide may further include a ridge part 240, which makes contact with the anti-reflection facet 254 and the high-reflection facet 252 and is narrower than the optical waveguide.

In the linear active waveguide region 222, the passive waveguide layer 212 may be provided on the entire surface of the substrate 110. In the bent active waveguide region 224, the tapered waveguide region 226, and the window region, the passive waveguide layer 212 may have a uniform width substantially equal to the maximal width of the tapered waveguide region 226. In the bent active waveguide region 224, the tapered waveguide region 226, and the window region, the passive waveguide layer 212 may have a width in the range from about 1 μm to about 10 μm. The passive waveguide layer 212 may be an n-InGaAsP layer.

Although it is illustrated that the passive waveguide layer 212 is wider than the bent active waveguide region 224 of the active layer 220 in FIG. 3C, in the bent active waveguide region 224 of the active layer 220, the passive waveguide layer 212 has the same width as the width of the bent active waveguide region 224 of the active layer 220 as shown in FIG. 3A.

The lower clad layer 214 may be disposed between the passive waveguide layer 212 and the active layer 220 of the linear and bent active waveguide regions 222 and 224. The lower clad layer 214 may be an n-InP layer.

The active layer 220 may be divided into the linear active waveguide region 222, the bent active waveguide region 224, and the tapered waveguide region 226. The linear active waveguide region 222 and the bent active waveguide region 224 of the active layer 220 may have a buried heterostructure (BH), and the tapered waveguide region 226 and the window region of the active layer 220 may have a buried ridge stripe (BRS) structure.

The bent active waveguide region 224 and the tapered waveguide region 226 may be connected to each other by a butt-coupling method, and thus a butt interface 228 may be formed between the bent active waveguide region 224 and the tapered waveguide region 226. The butt interface 228 between the bent active waveguide region 224 and the tapered waveguide region 226 may have an angle of about 5°~45° with the linear active waveguide region 222.

An end of the tapered waveguide region 226 has a size of 0.1 μm or lower. The linear active waveguide region 222 and the passive waveguide layer 212 have the same width of about 1 μm to about 10 μm, and the end of the tapered waveguide region 226 has a size of about 0.1 μm. Therefore, optical mode size can be varied. In addition, back reflection of light can be reduced.

The tapered waveguide region 226 is provided to reduce reflection of light at an input/output facet. For this end, the tapered waveguide region 226 may make an angle of about 5°~15° with a light propagation direction. If the tapered waveguide region 226 is largely sloped, reflection of light at the input/output facet can be largely reduced. In this case, however, optical loss at the bent active waveguide region 224 increases, and thus the gain of the external cavity laser light source reduces. Meanwhile, such optical loss can be minimized because optical coupling efficiency increases owing to the passive waveguide layer 212 disposed at the under side of the active layer 220.

The active layer 220 may have a polarization-dependent, stress-relaxation multiple quantum well (MQW) structure or a polarization-independent stress relaxation bulk structure. In the case where the active layer 220 has a MQW structure, the external cavity laser light source may be an SLD. If the active layer 220 has a bulk structure, the external cavity laser light source may be an R-SOA.

The upper clad layer 236 may cover the passive waveguide layer 212 and the active layer 220. The upper clad layer 236 may be a p-InP layer.

The current blocking layer may be disposed in the vicinity of the active layer 220. The current blocking layer may include the lower clad layer 214, a first current blocking layer 232, a second current blocking layer 234, and the upper clad layer 236 that are sequentially stacked. The current blocking layer may prevent a current from flowing out of the active layer 220. The first current blocking layer 232 may be a p-InP layer, and the second current blocking layer 234 may be an n-InP layer.

The trenches 239 may be formed at sides of the active layer 220 by partially removing the active layer 220 and the substrate 210. For example, the trenches 239 may be formed in the vicinity of the active layer 220 by sequentially etching portions of the upper clad layer 236, the second current blocking layer 234, the first current blocking layer 232, the lower clad layer 214, and the substrate 210. In an etching process, the ridge part 240 of the optical waveguide may be formed together with the trenches 239. The substrate 210 at an outside of the BRS structure may be etched to have an upper surface which is lower than a lower surface of the passive waveguide layer 212 about 1 μm to about 5 μm.

For high-speed modulation of more than 1.25 Gb/s, the trenches 239 may reduce parasitic capacitance in the vicinities of the active layer 220 and the current blocking layer provided to prevent outflow of current from the active layer 220. Therefore, the external cavity laser light source can have high-speed modulation ability of more than 1.25 Gb/s.

The lower electrode 242 may be disposed on the bottom surface of the substrate 210, and the upper electrode 246 may be disposed at the upper clad layer 236 with the ohmic layer 244 being disposed therebetween. The lower electrode 242 may be an n-type electrode, and the upper electrode 246 may be a p-type electrode. The ohmic layer 244 may be a p-InGaAs layer.

The high-reflection facet 252 may be disposed at an end of the linear active waveguide region 222 of the optical waveguide, and the anti-reflection facet 254 may be disposed at an end of the window region of the optical waveguide opposite to the high-reflection facet 252. The high-reflection facet 252 may increase the gain of the external cavity laser light source, and the anti-reflection facet 254 may reduce reflection at the output facet of the external cavity laser light source.

According to the above-described embodiments of the present invention, the SLD includes the ridge optical waveguide in which the active layer and the passive waveguide layer are configured to have the same width at least in the bent active waveguide region, the tapered waveguide region, and the window region, so that the SLD can emit a circular light having a narrow FFP. Owing to this narrow FFP characteristic, the SLD can have good characteristics such as high gain in a low current range, low power consumption owing to a low threshold current, and good high-frequency modulation characteristics of more than 1.25 Gb/s.

In addition, according to the above-described embodiments of the present invention, the R-SOA includes the ridge optical waveguide in which the active layer and the passive waveguide layer are configured to have the same width at least in the bent active waveguide region, the tapered waveguide region, and the window region, so that the R-SOA can emit a circular light having a narrow FFP. Owing to this narrow FFP characteristic, the R-SOA can have good characteristics such as high gain in a low current range, low power consumption owing to a low threshold current, and good high-frequency modulation characteristics of more than 1.25 Gb/s.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An external cavity laser light source comprising:
   a substrate;
   an optical waveguide comprising a passive waveguide layer, a lower clad layer, an active layer, and an upper clad layer that are sequentially stacked on the substrate, the optical waveguide being divided into regions comprising a linear active waveguide region, a bent active waveguide region, a tapered waveguide region, and a window region; and
   a current blocking layer formed an outside of the active layer to reduce a leakage current,
   wherein the linear active waveguide region and the bent active waveguide region have a buried heterostructure (BH), and the tapered waveguide region and the window region have a buried ridge stripe (BRS) structure, and
   wherein the passive waveguide layer has the substantially same width as that of the linear active waveguide region and is provided in the linear active waveguide region, the bent active waveguide region, the tapered waveguide region, and the window region.

2. The external cavity laser light source of claim 1, wherein the active layer has a polarization-dependent multiple quantum well (MQW) structure.

3. The external cavity laser light source of claim 1, wherein the active layer has a polarization-independent bulk structure.

4. The external cavity laser light source of claim 1, wherein the tapered waveguide region has a length of about 110 µm.

5. The external cavity laser light source of claim 1, wherein the bent active waveguide region and the tapered waveguide region are connected to each other by a butt-coupling method.

6. The external cavity laser light source of claim 5, wherein a butt interface between the bent active waveguide region and the tapered waveguide region makes angle of about 5°~45° with the linear active waveguide region.

7. The external cavity laser light source of claim 1, further comprising a trench formed at the outside of the active layer by removing portions of the current blocking layer and the substrate.

8. The external cavity laser light source of claim 7, wherein the external cavity laser light source has modulation characteristics of more than 1.25 Gb/s owing to the trench.

9. The external cavity laser light source of claim 7, wherein the substrate at an outside of the BRS structure is etched to have an upper surface which is lower than a lower surface of the passive waveguide layer about 1 µm to about 5 µm.

10. The external cavity laser light source of claim 1, wherein the passive waveguide layer has a width of about 1 µm to about 10 µm.

11. An external cavity laser light source comprising:
    a substrate;
    an optical waveguide comprising a passive waveguide layer, a lower clad layer, an active layer, and an upper clad layer that are sequentially stacked on the substrate, the optical waveguide being divided into regions comprising a linear active waveguide region, a bent active waveguide region, a tapered waveguide region, and a window region; and
    a current blocking layer formed an outside of the active layer to reduce leakage current,
    wherein the linear active waveguide region and the bent active waveguide region have a buried heterostructure (BH), and the tapered waveguide region and the window region have a buried ridge stripe (BRS) structure, and
    wherein the passive waveguide layer is provided on an entire surface of the substrate in the linear active waveguide region and has a width substantially equal to a maximal width of the tapered waveguide region in the bent active waveguide region, the tapered waveguide region, and the window region.

12. The external cavity laser light source of claim 11, wherein the active layer has a polarization-dependent multiple quantum well (MQW) structure.

13. The external cavity laser light source of claim 11, wherein the active layer has a polarization-independent bulk structure.

14. The external cavity laser light source of claim 11, wherein the tapered waveguide region has a length of about 110 µm.

15. The external cavity laser light source of claim 11, wherein the bent active waveguide region and the tapered waveguide region are connected to each other by a butt-coupling method.

16. The external cavity laser light source of claim 15, wherein a butt interface between the bent active waveguide region and the tapered waveguide region makes angle of about 5°~45° with the linear active waveguide region.

17. The external cavity laser light source of claim 11, further comprising a trench formed at the outside of the active layer by removing portions of the current blocking layer and the substrate.

18. The external cavity laser light source of claim 17, wherein the external cavity laser light source has modulation characteristics of more than 1.25 Gb/s owing to the trench.

19. The external cavity laser light source of claim 17, wherein the substrate at an outside of the BRS structure is etched to have an upper surface which is lower than a lower surface of the passive waveguide layer about 1 µm to about 5 µm.

20. The external cavity laser light source of claim 11, wherein the passive waveguide layer provided in the bent active waveguide region, the tapered waveguide region, and the window region have a width of about 1 µm to about 10 µm.

* * * * *